(12) United States Patent
Min et al.

(10) Patent No.: US 11,639,469 B2
(45) Date of Patent: May 2, 2023

(54) SEMICONDUCTOR NANOCRYSTAL PARTICLES AND PRODUCTION METHODS THEREOF

(71) Applicants: SAMSUNG ELECTRONICS CO., LTD., Suwon-si (KR); The Governing Council of the University of Toronto, Toronto (CA)

(72) Inventors: Jihyun Min, Seoul (KR); Eun Joo Jang, Suwon-si (KR); Hyo Sook Jang, Suwon-si (KR); Ankit Jain, Toronto (CA); Edward Sargent, Toronto (CA); Oleksandr Voznyy, Thornhill (CA); Larissa Levina, Toronto (CA); Sjoerd Hoogland, Toronto (CA); Petar Todorovic, Toronto (CA); Makhsud Saidaminov, Toronto (CA)

(73) Assignees: SAMSUNG ELECTRONICS CO., LTD., Gyeonggi-Do (KR); THE GOVERNING COUNCIL OF THE UNIVERSITY OF TORONTO, Toronto (CA)

( * ) Notice: Subject to any disclaimer, the term of this patent is extended or adjusted under 35 U.S.C. 154(b) by 863 days.

(21) Appl. No.: 16/254,676

(22) Filed: Jan. 23, 2019

(65) Prior Publication Data
US 2019/0225883 A1  Jul. 25, 2019

(30) Foreign Application Priority Data
Jan. 23, 2018  (KR) ........................ 10-2018-0008375

(51) Int. Cl.
*C09K 11/02* (2006.01)
*C09K 11/88* (2006.01)
(Continued)

(52) U.S. Cl.
CPC .......... *C09K 11/885* (2013.01); *C01B 19/002* (2013.01); *C01G 23/002* (2013.01);
(Continued)

(58) Field of Classification Search
CPC ....... C09K 11/025; C09K 11/02; C09K 11/88; C09K 11/885; C09K 11/673;
(Continued)

(56) References Cited

U.S. PATENT DOCUMENTS 4,041,140 A * 8/1977 Nitta ..................... C04B 35/547
423/566.1
8,597,730 B2  12/2013 Pickett et al.
(Continued)

FOREIGN PATENT DOCUMENTS

CN  102177095 A  9/2011
CN  104205368 A  12/2014
(Continued)

OTHER PUBLICATIONS

Meng et al., "Alloying and Defect Control within Chalcogenide Perovskites for Optimized Photovoltaic Application", Jan. 11, 2016, Chemistry of Materials, 28, 3, pp. 821-829. (Year: 2016).*
(Continued)

*Primary Examiner* — Matthew E. Hoban
*Assistant Examiner* — Lynne Edmondson
(74) *Attorney, Agent, or Firm* — Cantor Colburn LLP

(57) ABSTRACT

A semiconductor nanocrystal particle including a transition metal chalcogenide represented by Chemical Formula 1, the semiconductor nanocrystal particle having a size of less than or equal to about 100 nanometers, and a method of producing the same:

$M^1M^2Cha_3$   Chemical Formula 1 wherein $M^1$ is Ca, Sr, Ba, or a combination thereof,
(Continued)

$M^2$ is Ti, Zr, Hf, or a combination thereof, and Cha is S, Se, Te, or a combination thereof.

25 Claims, 4 Drawing Sheets

(51) Int. Cl.
| | | |
|---|---|---|
| C09K 11/67 | (2006.01) | |
| C01G 25/00 | (2006.01) | |
| C01G 23/00 | (2006.01) | |
| C01B 19/00 | (2006.01) | |
| B82Y 40/00 | (2011.01) | |
| B82Y 20/00 | (2011.01) | |
| H01L 21/02 | (2006.01) | |

(52) U.S. Cl.
CPC .......... *C01G 25/006* (2013.01); *C09K 11/673* (2013.01); *B82Y 20/00* (2013.01); *B82Y 40/00* (2013.01); *C01P 2002/72* (2013.01); *C01P 2002/84* (2013.01); *C01P 2004/04* (2013.01); *C01P 2004/64* (2013.01); *H01L 21/02568* (2013.01); *H01L 21/02601* (2013.01)

(58) Field of Classification Search
CPC ............ C09K 11/881; C04B 2235/781; C04B 35/547; C01P 2004/64; C01P 2004/62; B82Y 20/00
See application file for complete search history.

(56) References Cited

U.S. PATENT DOCUMENTS

| | | |
|---|---|---|
| 9,751,761 B2 | 9/2017 | Lee et al. |
| 9,834,724 B2 | 12/2017 | Kim et al. |
| 10,074,770 B2 | 9/2018 | Park et al. |
| 10,236,410 B2 | 3/2019 | Liu et al. |
| 10,553,750 B2 | 2/2020 | Liu et al. |
| 10,559,712 B2 | 2/2020 | Park et al. |
| 11,011,672 B2 | 5/2021 | Park et al. |
| 2006/0239882 A1 | 10/2006 | Seo et al. |
| 2010/0044636 A1 | 2/2010 | Ramprasad et al. |
| 2010/0068522 A1 | 3/2010 | Pickett et al. |
| 2013/0221291 A1* | 8/2013 | Ramprasad ............. H01L 33/06 252/519.4 |
| 2014/0155640 A1 | 6/2014 | Pickett et al. |
| 2014/0199800 A1 | 7/2014 | Vockic et al. |
| 2015/0021548 A1 | 1/2015 | Liu et al. |
| 2015/0083969 A1 | 3/2015 | Kim et al. |
| 2017/0179338 A1 | 6/2017 | Park et al. |
| 2017/0342316 A1* | 11/2017 | Luther .................... H01G 9/20 |
| 2019/0006556 A1 | 1/2019 | Park et al. |
| 2019/0198710 A1 | 6/2019 | Liu et al. |
| 2020/0220043 A1 | 7/2020 | Park et al. |

FOREIGN PATENT DOCUMENTS

| | | |
|---|---|---|
| CN | 104512860 A | 4/2015 |
| CN | 106957652 A | 7/2017 |
| CN | 107221684 A | 9/2017 |
| EP | 3159392 A1 | 4/2017 |
| EP | 3168278 A1 | 5/2017 |
| JP | 4243690 B2 | 3/2009 |
| KR | 0963538 B1 | 6/2010 |
| KR | 20140034573 A | 3/2014 |
| KR | 20170019249 A | 2/2017 |
| KR | 20170041091 A | 4/2017 |

OTHER PUBLICATIONS

Perera et al., "Chalcogenide perovskites—an emerging class of ionic semiconductors", Feb. 15, 2016, Nano Energy, 22, pp. 129-135 . (Year: 2016).*

Samanthe Perera et al., "Chalcogenideperovskites—an emergingclass of ionicsemiconductors", Science Direct, Feb. 15, 2016, pp. 129-135, vol. 22.

Shanyuan Niu et al., "Bandgap Control via Structural and Chemical Tuning of Transition Metal Perovskite Chalcogenides", Advanced Materials, Dec. 22, 2016, pp. 1-6, vol. 29, Issue 9.

Weiwei Meng et al., "Alloying and Defect Control within Chalcogenide Perovskites for Optimized Photovoltaic Application", Chemistry of Materials, Jan. 11, 2016, pp. 821-829, vol. 28.

Extended European Search Report dated Jun. 6, 2019, of the corresponding European Patent Application No. 19020042.8.

Samanthe Perera et al., "Chalcogenide perovskites—an emerging class of ionic semiconductors," Nano Engergy, Feb. 15, 2016, pp. 129-135, vol. 22.

Wan-Jian Yin et al. "Unique Properties of Halide Perovskites as Possible Origins of the Superior Solar Cell Performance," Advanced Materials, Jul. 16, 2014, pp. 4653-4658, vol. 26, Issue 27.

Office Action dated Nov. 22, 2022, of the corresponding Chinese Patent Application No. 201910062615.X.

* cited by examiner

SEMICONDUCTOR NANOCRYSTAL PARTICLES AND PRODUCTION METHODS THEREOF

CROSS-REFERENCE TO RELATED APPLICATION

This application claims priority to and the benefit of Korean Patent Application No. 10-2018-0008375 filed in the Korean Intellectual Property Office on Jan. 23, 2018, and all the benefits accruing therefrom under 35 U.S.C. § 119, the entire content of which is incorporated herein by reference.

BACKGROUND

1. Field

Semiconductor nanocrystal particles and production methods thereof are disclosed.

2. Description of the Related Art

Unlike bulk materials, in case of the nano-particles, some physical characteristics (e.g., energy bandgaps and melting points), which are intrinsic for the bulk materials, may be controlled by changing a particle size thereof. For example, a semiconductor nanocrystal particle also known as a quantum dot is a nano-sized crystalline material. Such a semiconductor nanocrystal particle has a relatively small size, has a large surface area per unit volume, and exhibits a quantum confinement effect, showing properties different from those of a bulk material having the same composition. The quantum dot may absorb light from an excitation source to be excited, and may emit energy corresponding to an energy bandgap of the quantum dot.

However, quantum dots capable of showing improved photoluminescence properties may include a heavy metal such as cadmium or lead. Cadmium and lead are environmentally-restricted elements. Accordingly, development of environmentally-friendly quantum dots including no heavy metals is desired.

SUMMARY

An embodiment provides an environmentally-friendly semiconductor nanocrystal particle having good photoluminescence properties.

An embodiment provides a method of producing the semiconductor nanocrystal particle.

In an embodiment, a semiconductor nanocrystal particle includes a transition metal chalcogenide represented by Chemical Formula 1, the semiconductor nanocrystal particle having a size of less than or equal to about 100 nanometers (nm).

$$M^1M^2Cha_3 \quad \text{Chemical Formula 1}$$

wherein $M^1$ is Ca, Sr, Ba, or a combination thereof,
$M^2$ is Ti, Zr, Hf, or a combination thereof, and
Cha is S, Se, Te, or a combination thereof.

The transition metal chalcogenide may include $BaZrS_3$, $SrZrS_3$, $CaZrS_3$, $SrTiS_3$, $BaTiS_3$, or $BaZr_{1-x}Ti_xS_3$, wherein x is greater than 0 and less than or equal to 0.5;

$BaZrSe_3$, $SrZrSe_3$, $CaZrSe_3$, $SrTiSe_3$, $BaTiSe_3$, or $BaZr_{1-x'}Ti_{x'}Se_3$, wherein x' is greater than 0 and less than or equal to 0.5;

$BaZrTe_3$, $SrZrTe_3$, $CaZrTe_3$, $SrTiTe_3$, $BaTiTe_3$, or $BaZr_{1-x''}Ti_{x''}Te_3$, wherein x'' is greater than 0 and less than or equal to 0.5; or a combination thereof.

The semiconductor nanocrystal particle (e.g., the transition metal chalcogenide) may include a perovskite crystal structure.

The semiconductor nanocrystal particle may have a size of less than or equal to about 20 nm.

The semiconductor nanocrystal particle may have a size of less than or equal to about 10 nm.

The semiconductor nanocrystal particle may have a size of less than or equal to about 5 nm.

The semiconductor nanocrystal particle may have quantum efficiency of greater than or equal to about 10%.

The semiconductor nanocrystal particle may have quantum efficiency of greater than or equal to about 20%.

The semiconductor nanocrystal particle may have quantum efficiency of greater than or equal to about 30%.

The semiconductor nanocrystal particle may include an organic ligand on a surface of the semiconductor nanocrystal particle.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, $RHPOOH$, $R_2POOH$, or a combination thereof, wherein R and R' each independently is a substituted or unsubstituted C1 to C40 aliphatic hydrocarbon group, a substituted or unsubstituted C6 to C40 aromatic hydrocarbon group, or a combination thereof.

The semiconductor nanocrystal particle may include a carboxylic acid compound or a derivative thereof, the carboxylic acid compound or a derivative thereof having 10 or more carbon atoms and being bound to a surface of the semiconductor nanocrystal particle.

An embodiment provides a population of a plurality of semiconductor nanocrystal particles, wherein the plurality of semiconductor nanocrystal particles includes a transition metal chalcogenide represented by Chemical Formula 1, the semiconductor nanocrystal particle having an average particle size of less than or equal to about 100 nm:

$$M^1M^2Cha_3 \quad \text{Chemical Formula 1}$$

wherein $M^1$ is Ca, Sr, Ba, or a combination thereof,
$M^2$ is Ti, Zr, Hf, or a combination thereof, and
Cha is S, Se, Te, or a combination thereof.

The transition metal chalcogenide may include
$BaZrS_3$, $SrZrS_3$, $CaZrS_3$, $SrTiS_3$, $BaTiS_3$, $BaZr_{1-x}Ti_xS_3$, wherein x is greater than 0 and less than or equal to 0.5, or a combination thereof;

$BaZrSe_3$, $SrZrSe_3$, $CaZrSe_3$, $SrTiSe_3$, $BaTiSe_3$, $BaZr_{1-x'}Ti_{x'}Se_3$, wherein x' is greater than 0 and less than or equal to 0.5, or a combination thereof;

$BaZrTe_3$, $SrZrTe_3$, $CaZrTe_3$, $SrTiTe_3$, $BaTiTe_3$, $BaZr_{1-x''}Ti_{x''}Te_3$, wherein x'' is greater than 0 and less than or equal to 0.5, or a combination thereof; or a combination thereof.

The plurality of semiconductor nanocrystal particles may have an average particle size of less than or equal to about 20 nm.

The plurality of semiconductor nanocrystal particles may exhibit a quantum efficiency of greater than or equal to about 30%.

In an embodiment, a method of producing the semiconductor nanocrystal particle according to an embodiment includes heating a first metal precursor, a second metal precursor, and a chalcogen precursor in the presence of an organic solvent and a ligand compound at a temperature of greater than or equal to about 100° C. and less than or equal to about 400° C. to form a semiconductor nanocrystal particle, wherein the first metal precursor includes Ca, Sr, Ba, or a combination thereof, the second metal precursor includes Ti, Zr, Hf, or a combination thereof, the chalcogen precursor includes S, Se, Te, or a combination thereof, the semiconductor nanocrystal particle includes a transition metal chalcogenide represented by Chemical Formula 1, the semiconductor nanocrystal particle having a size of less than or equal to about 100 nm:

$$M^1M^2Cha_3 \quad \text{Chemical Formula 1}$$

wherein $M^1$, $M^2$, and Cha are the same as defined as above.

The first metal precursor may be a metal powder, an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, or a combination thereof.

The second metal precursor may be a metal powder, an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, or a combination thereof.

The chalcogen precursor may be a thiol compound, sulfur dispersed in a phosphine or amine solvent, selenium and a phosphine or amine solvent, tellurium dispersed in a phosphine or amine solvent, or a combination thereof.

The organic solvent may include a primary amine having about 6 or more carbon atoms, a secondary amine having about 6 or more carbon atoms, a tertiary amine having about 6 or more carbon atoms, a nitrogen-containing heterocyclic compound, a aliphatic hydrocarbon having about 6 or more carbon atoms, an aromatic hydrocarbon having about 6 or more carbon atoms, a phosphine compound having an aliphatic hydrocarbon group having about 6 or more carbon atoms, a phosphine oxide compound having an aliphatic hydrocarbon group having about 6 or more carbon atoms, an aromatic ether, or a combination thereof.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', RHPOOH, $RPO(OH)_2$, $R_2POOH'$, or a combination thereof, wherein R and R' each independently is a substituted or unsubstituted C1 to C40 aliphatic hydrocarbon group, a substituted or unsubstituted C6 to C40 aromatic hydrocarbon group, or a combination thereof.

The heating may include reacting the first metal precursor with the ligand compound to form a first intermediate, reacting the second metal precursor with the ligand compound to form a second intermediate, or a combination thereof.

The heating may include reacting the first metal precursor with the ligand compound to form a first intermediate, and reacting the first intermediate with the chalcogen precursor to form a third intermediate.

The method may further include reacting the third intermediate with the second metal precursor.

In an embodiment, an electronic device includes the semiconductor nanocrystal particle.

The electronic device may be a display device, a light emitting diode (LED), a quantum dot light emitting diode (QLED), an organic light emitting diode (OLED), a sensor, an imaging sensor, or a solar cell device.

Environmentally-friendly semiconductor nanocrystal particles having good photoluminescence properties may be provided. The produced environmentally-friendly semiconductor nanocrystal particle may be applied to various display devices, biolabeling (biosensor, bioimaging), a photodetector, a solar cell, a hybrid composite, and the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
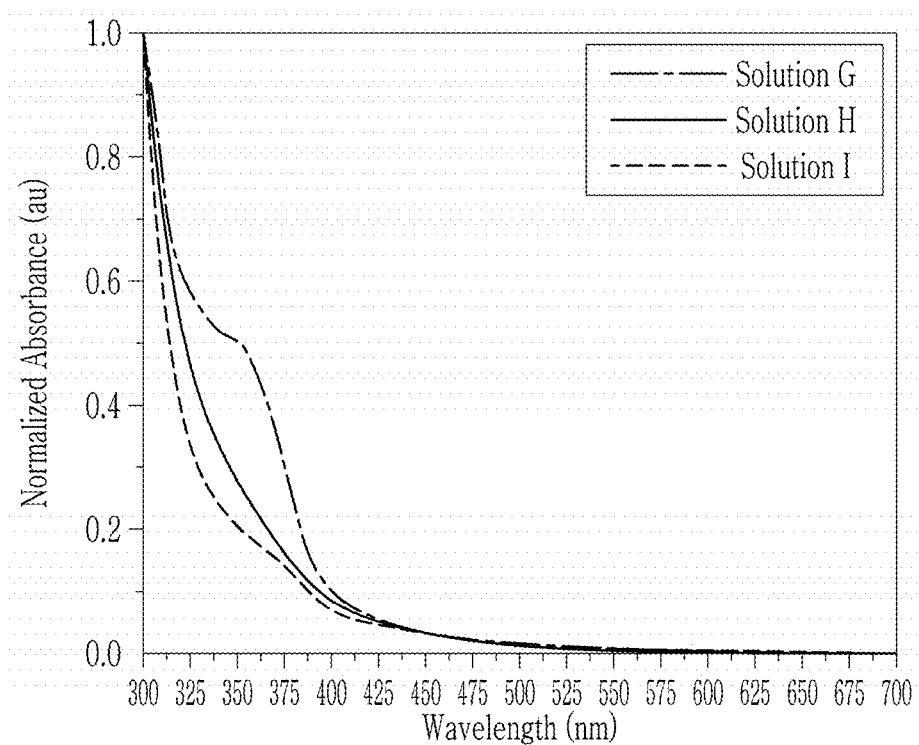
FIG. 1 shows ultraviolet (UV)-Vis absorption spectra showing the semiconductor nanocrystal particles produced in Examples 1 to 3.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer" or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" may refer to replacement of hydrogen of a compound or the corresponding moiety by a substituent selected from a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C30 cycloalkenyl group, a C3 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group(—C(=NH)NH$_2$)), a hydrazino group(—NHNH$_2$), a hydrazono group (=N (NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

Herein, a "hydrocarbon" or hydrocarbon group refers to a group including carbon and hydrogen (e.g., an alkyl, alkenyl, alkynyl, or aryl group). The hydrocarbon group may be a group having a monovalence or greater formed by removal of one or more hydrogen atoms from, alkane, alkene, alkyne, or arene. In the hydrocarbon group, at least one methylene may be replaced by an oxide moiety, a carbonyl moiety, an ester moiety, —NH—, or a combination thereof.

Herein, "aliphatic" refers to a saturated or unsaturated linear or branched hydrocarbon group. An aliphatic group may be an alkyl, alkenyl, or alkynyl group, for example.

Herein, "alkyl" refers to a linear or branched saturated monovalent hydrocarbon group (methyl, ethyl hexyl, etc.).

Herein, "alkenyl" refers to a linear or branched monovalent hydrocarbon group having one or more carbon-carbon double bond.

Herein, "alkynyl" refers to a linear or branched monovalent hydrocarbon group having one or more carbon-carbon triple bond.

Herein, "aromatic" refers to an organic compound or group comprising at least one unsaturated cyclic group having delocalized pi electrons. The term encompasses both hydrocarbon aromatic compounds and heteroaromatic compounds.

Herein, "aryl" refers to a group formed by removal of at least one hydrogen from an aromatic group (e.g., a phenyl or naphthyl group).

Herein, "hetero" refers to one including 1 to 3 heteroatoms of N, O, S, Si, P, or a combination thereof.

Herein, "Group" refers to a group of Periodic Table.

Herein, the term "quantum efficiency" is interchangeable with the term "quantum yield."

The quantum efficiency may be measured by using a commercially available fluorescence spectrometer (e.g., manufactured by Hitachi Co. Ltd., or Otsuka Co., Ltd.) in any appropriate manner, (e.g., a direct method or a relative method).

Semiconductor nanocrystal particles (hereinafter, also referred to as quantum dots) may absorb light from an excitation source and may emit energy corresponding to the energy bandgap of the semiconductor nanocrystal particles. Energy bandgaps of quantum dots may be changed according to their sizes and compositions. For example, as the sizes of quantum dots increase, the quantum dots may have narrower energy bandgaps and longer light emitting wavelengths. Quantum dots may be used as a light emitting material in various fields of a display device, an energy device, or a bio light emitting device. However, a plurality of quantum dots having photoluminescence properties at an applicable level may be based on cadmium (Cd) or lead (Pb). Cadmium and lead (Pb) may cause environment/health problems and a restricted element by Restriction of Hazardous Substances Directive (RoHS) in a plurality of countries. Accordingly, an embodiment provides quantum dots with good luminous properties that do not include lead and cadmium.

A semiconductor nanocrystal particle according to an embodiment includes a transition metal chalcogenide represented by Chemical Formula 1 and has a size of less than or equal to about 100 nm:

$$M^1M^2Cha_3 \quad \text{Chemical Formula 1}$$

wherein $M^1$ is Ca, Sr, Ba, or a combination thereof,
$M^2$ is Ti, Zr, Hf, or a combination thereof, and
Cha is S, Se, Te, or a combination thereof.

An embodiment provides a population including a plurality of above semiconductor nanocrystal particles.

In the semiconductor nanocrystal particle according to an embodiment, the transition metal chalcogenide may include $BaZrS_3$, $SrZrS_3$, $CaZrS_3$, $SrTiS_3$, $BaTiS_3$, or $BaZr_{1-x}Ti_xS_3$, wherein x is greater than 0 and less than or equal to 0.5; $BaZrSe_3$, $SrZrSe_3$, $CaZrSe_3$, $SrTiSe_3$, $BaTiSe_3$, or $BaZr_{1-x'}Ti_{x'}Se_3$, wherein x' is greater than 0 and less than or equal to 0.5; $BaZrTe_3$, $SrZrTe_3$, $CaZrTe_3$, $SrTiTe_3$, $BaTiTe_3$, or $BaZr_{1-x''}Ti_{x''}Te_3$, wherein x" is greater than 0 and less than or equal to 0.5; or a combination thereof. The semiconductor nanocrystal particle may include a perovskite crystal structure.

The transition metal chalcogenide including the perovskite crystal structure and represented by Chemical Formula 1 may be synthesized through a heat treatment at a high temperature (e.g., greater than or equal to about 800° C.). The transition metal chalcogenide may form powder having a size of micrometer (μm), but it may be difficult or practically impossible for the formed particles to have a controlled size of less than a Bohr radius. It may also difficult for the formed particles to have additional passivation on a surface thereof and the formed particles may not show a desired dispersibility in an organic solvent. The semiconductor nanocrystal particle according to an embodiment may be synthesized in a solution-based synthesis method which will be described later and thus may have a nanometer particle size and include an organic ligand adhered on the surface thereof.

Accordingly, the semiconductor nanocrystal particle may have a size (or an average size) of less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, less than or equal to about 20 nm, less than or equal to about 15 nm, less than or equal to about 10 nm, less than or equal to about 9 nm, less than or equal to about 8 nm, less than or equal to about 7 nm, less than or equal to about 6 nm, less than or equal to about 5 nm, less than or equal to about 4 nm, less than or equal to about 3.5 nm, less than or equal to about 3.4 nm, less than or equal to about 3.3 nm, or less than or equal to about 3.2 nm. The semiconductor nanocrystal particle may have a size (or an average size) of greater than or equal to about 0.5 nm, for example, greater than or equal to about 1 nm, greater than or equal to about 1.5 nm, or greater than or equal to about 2 nm.

The semiconductor nanocrystal particle may have any suitable shape. The semiconductor nanocrystal may have a spherical, oval, polygon, multipod, or polyhedron shape, or a combination thereof.

The semiconductor nanocrystal particle according to an embodiment may have a maximum photoluminescence peak in a wavelength of greater than or equal to about 430 nm, for example greater than or equal to about 440 nm, greater than or equal to about 450 nm, greater than or equal to about 460 nm, greater than or equal to about 470 nm, greater than or equal to about 480 nm, greater than or equal to about 490 nm, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, or greater than or equal to about 600 nm. The semiconductor nanocrystal particle according to an embodiment may have a maximum photoluminescence peak in a wavelength of less than or equal to about 1,200 nm, for example, less than or equal to about 1,150 nm, less than or equal to about 1,130 nm, less than or equal to about 1,100 nm, less than or equal to about 1,000 nm, less than or equal to about 900 nm, less than or equal to about 800 nm, less than or equal to about 700 nm, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, less than or equal to about 540 nm, less than or equal to about 530 nm, less than or equal to about 520 nm, less than or equal to about 510 nm, less than or equal to about 500 nm, less than or equal to about 490 nm, less than or equal to about 480 nm, or less than or equal to about 470 nm. For example, the semiconductor nanocrystal particle may emit blue light having a maximum photoluminescence peak in a wavelength of about 400 nm to about 470 nm. The semiconductor nanocrystal particle may emit green light having a maximum photoluminescence peak in a wavelength of about 500 nm to about 560 nm.

The semiconductor nanocrystal particle may emit green light having a maximum photoluminescence peak in a wavelength of greater than or equal to about 510 nm (e.g., greater than or equal to about 520 nm) and less than or equal to about 550 nm (or less than or equal to about 540 nm). The semiconductor nanocrystal particle may emit red light having a maximum photoluminescence peak in a wavelength of about 600 nm to about 650 nm. The light emitting wavelengths of the semiconductor nanocrystal particle may be controlled by compositions of the transition metal chalcogenide, sizes of the particle, shapes of the particles, and/or passivation of organic ligands.

The semiconductor nanocrystal particle may have for example, a full width at half maximum (FWHM) of less than or equal to about 80 nm, less than or equal to about 70 nm, less than or equal to about 60 nm, less than or equal to about 50 nm, less than or equal to about 45 nm, less than or equal to about 40 nm, less than or equal to about 35 nm, or less than or equal to about 30 nm in a photoluminescence wavelength spectrum.

The semiconductor nanocrystal particle may have quantum efficiency of greater than or equal to about 10%, for example, greater than or equal to about 11%, greater than or equal to about 15%, greater than or equal to about 20%, greater than or equal to about 25%, or greater than or equal to about 30%.

The semiconductor nanocrystal particle may include an organic ligand on a surface of the semiconductor nanocrystal particle. The organic ligand may be bound to the surface of the quantum dot. Without wishing to be bound by any theory, the organic ligand may remove a defect on the particle surface. In a synthesis process described below, a coordination-type organic solvent or ligand compound is coordinated on, e.g., bound to, the surface of the semiconductor nanocrystal and thus may control growth of the particle and become an organic ligand.

The organic ligand may include RCOOH, RNH$_2$, R$_2$NH, R$_3$N, RSH, R$_3$PO, R$_3$P, ROH, RCOOR', RPO(OH)$_2$, RHPOOH, R$_2$POOH, wherein R and R' are each independently a substituted or unsubstituted C3 (or C5) to C24 aliphatic hydrocarbon group such as C3 to C24 alkyl or alkenyl, or a substituted or unsubstituted C6 to C20 aromatic hydrocarbon group such as a C6 to C20 aryl group, a polymer organic ligand, or a combination thereof.

Examples of the ligand compound may be thiol compounds such as methane thiol, ethane thiol, propane thiol, butane thiol, pentane thiol, hexane thiol, octane thiol, dodecane thiol, hexadecane thiol, octadecane thiol, or benzyl thiol; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine; carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine compounds such as methyl phosphine, ethyl phosphine, propyl phosphine, butyl phosphine, pentyl phosphine, octylphosphine, dioctyl phosphine, tributyl phosphine, or trioctyl phosphine; phosphine oxide compounds such as methyl phosphine oxide, ethyl phosphine oxide, propyl phosphine oxide, butyl phosphine oxide, pentyl phosphine oxide, tributylphosphine oxide, octylphosphine oxide, dioctyl phosphine oxide, or trioctylphosphine oxide; diphenyl phosphine, triphenyl phosphine compounds, or an oxide compound thereof; C5 to C20 alkyl phosphonic acid, C5 to C20 alkyl phosphinic acid such as hexylphosphinic acid, octylphosphinic acid, dodecanephosphinic acid, tetradecanephosphinic acid, hexadecanephosphinic acid, or octadecanephosphinic acid, but is not limited thereto. The quantum dot may include one or more organic ligands.

Examples of the coordination-type organic solvent may include C6 to C22 primary amines such as hexadecylamine; C6 to C22 secondary amines such as dioctylamine; C6 to C40 tertiary amines such as trioctylamine; nitrogen-containing heterocyclic compounds such as pyridine; C6 to C40 aliphatic hydrocarbon (e.g., alkane, alkene, alkyne, etc.) such as hexadecane, octadecane, octadecene, or squalane; C6 to C30 aromatic hydrocarbons such as phenyldodecane, phenyltetradecane, or phenyl hexadecane; phosphines substituted with a C6 to C22 alkyl group such as trioctylphosphine; phosphine oxides substituted with a C6 to C22 alkyl group such as trioctylphosphine oxide; C12 to C22 aromatic ethers such as phenyl ether or benzyl ether, or a combination thereof, but are not limited thereto.

In an embodiment, a method of producing the semiconductor nanocrystal particle according to an embodiment may include heating a first metal precursor, a second metal precursor, and a chalcogen precursor in the presence of an organic solvent and a ligand compound at a reaction temperature of about 100° C. to about 400° C. to form the semiconductor nanocrystal particle.

In the method, the reaction temperature may be greater than or equal to about 100° C., greater than or equal to about 120° C., greater than or equal to about 140° C., greater than or equal to about 160° C., greater than or equal to about 180° C., greater than or equal to about 200° C., greater than or equal to about 220° C., greater than or equal to about 240° C., greater than or equal to about 260° C., greater than or equal to about 280° C., greater than or equal to about 300° C., greater than or equal to about 320° C., or greater than or equal to about 330° C. The reaction temperature may be less than or equal to about 400° C., less than or equal to about 390° C., less than or equal to about 380° C., less than or equal to about 370° C., or less than or equal to about 360° C. In some embodiments involving some organic precursors, the reaction temperature may be greater than or equal to about 50° C., for example, greater than or equal to about 60° C., or greater than or equal to about 70° C. and less than or equal to about 100° C., for example, less than or equal to about 90° C. or less than or equal to about 80° C. In the method, the reaction temperature may be controlled in each step. For example, an injection temperature of the precursor (a first temperature) may be set to be different from a growth temperature (a second temperature). In an embodiment, the first temperature may be higher than the second temperature. In an embodiment, the first temperature may be lower than the second temperature.

In the method, heating time is not particularly limited but appropriately determined. For example, the heating time may be greater than or equal to about 5 minutes, greater than or equal to about 10 minutes, greater than or equal to about 15 minutes, greater than or equal to about 20 minutes, greater than or equal to about 25 minutes, or greater than or equal to about 30 minutes. At each first and second temperature, the heating time may be respectively different.

A perovskite powder including a transition metal chalcogen compound may be prepared by a heat treatment at a high temperature (e.g., greater than or equal to about 800° C.). In contrast, in the method according to an embodiment, a particle is formed by a reaction between a metal precursor and a chalcogen precursor in an organic solution including a predetermined amount of on organic ligand at a relatively low temperature (e.g., less than or equal to about 400° C.). In this solution-based nanoparticle synthesis method according to an embodiment, a size and a shape of a nano-particle may be controlled. The synthesized nanocrystal particle has an organic ligand bound to a surface thereof, and this may contribute to a removal of a surface defect that may be present in the nanoparticle otherwise. According to the method of an embodiment, a size and a composition of a transition metal perovskite chalcogenide particle may be relatively easily controlled, and photoluminescence properties (e.g., a maximum photoluminescence peak wavelength, a full width at half maximum (FWHM), luminous efficiency, and the like) of the prepared particle may be improved.

The first metal precursor includes Ca, Sr, Ba, or a combination thereof. The second metal precursor includes Ti, Zr, Hf, or a combination thereof. The chalcogen precursor includes S, Se, Te, or a combination thereof.

The first metal precursor may include a metal powder, a C1 to C30 alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, or a combination thereof. For example, the first metal precursor may include a calcium metal powder, alkylated calcium, calcium alkoxide, calcium carboxylate (e.g., calcium acetate), calcium nitrate, calcium perchlorate, calcium sulfate, calcium acetylacetonate, calcium halide, calcium cyanide, calcium hydroxide, calcium oxide, calcium peroxide, a strontium metal powder, alkylated strontium, strontium alkoxide, strontium carboxylate (e.g., strontium acetate), strontium nitrate, strontium perchlorate, strontium sulfate, strontium acetylacetonate, strontium halide, strontium cyanide, strontium hydroxide, strontium oxide, strontium peroxide, a barium metal powder, alkylated barium, barium alkoxide, a barium carboxylate (e.g., barium acetate), barium nitrate, barium perchlorate, barium sulfate, barium acetylacetonate, barium halide, barium cyanide, barium hydroxide, barium oxide, barium peroxide, or a combination thereof.

The second metal precursor may include a metal powder, a C1 to C30 alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, or a combination thereof. For example, second metal precursor may include a titanium metal powder, alkylated titanium, titanium alkoxide, titanium carboxylate, titanium nitrate, titanium perchlorate, titanium sulfate, titanium acetylacetonate, titanium halide, titanium cyanide, titanium hydroxide, titanium oxide, titanium peroxide, a zirconium metal powder, alkylated zirconium, zirconium alkoxide, a zirconium carboxylate, zirconium nitrate, zirconium perchlorate, zirconium sulfate, zirconium acetylacetonate, zirconium halide, zirconium cyanide, zirconium hydroxide, zirconium oxide, zirconium peroxide, a hafnium metal powder, alkylated hafnium, hafnium alkoxide, hafnium carboxylate, hafnium nitrate, hafnium perchlorate, hafnium sulfate, hafnium acetylacetonate, hafnium halide, hafnium cyanide, hafnium hydroxide, hafnium oxide, hafnium peroxide, or a combination thereof.

The chalcogen precursor may include sulfur or sulfide, selenium or selenide, tellurium or telluride, hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bis(trimethylsilyl) sulfide, ammonium sulfide, sodium sulfide, selenium-trioctylphosphine (Se-TOP), selenium-tributylphosphine (Se-TBP), selenium-triphenylphosphine (Se-TPP), selenium-diphenylphosphine (Se-DPP), tellurium-tributylphosphine (Te-TBP), tellurium-triphenylphosphine (Te-TPP), tellurium-diphenylphosphine (Te-DPP), or a combination thereof.

In an embodiment, the chalcogen precursor may be a sulfur precursor such as sulfur dispersed in a solvent such as a (C10 or more) hydrocarbon, a (C10 or more) phosphine, or a (C10 or more) amine, a selenium precursor such as selenium dispersed in a solvent such as a (C10 or more) hydrocarbon, a (C10 or more) phosphine, or (C10 or more) amine, a tellurium precursor such as tellurium dispersed in a solvent such as a (C10 or more) hydrocarbon, (C10 or more) phosphine, or (C10 or more) amine, or a combination thereof. The phosphine or amine solvent may include di/trialkylphosphines having at least two C3 to C30 alkyl groups such as trioctylphosphine or tributylphosphine, di/triarylphosphines having at least two C6 to C30 aryl groups such as triphenylphosphine or diphenylphosphine, di/trialkylamines having at least two C6 to C30 alkyl groups such as trioctyl amine, or a combination thereof. The hydrocarbon solvent may include C10-C30 alkenes such as octadecene.

Details of the ligand compound and the organic solvent are the same as set forth above with respect to the organic ligand and the organic solvent.

The heating may include reacting the first metal precursor with the ligand compound to form a first intermediate. For example, a barium oxide (or a barium carboxylate such as barium acetate) and a carboxylic acid compound (e.g., oleic acid) may react to form barium oleate. The heating may include reacting the second metal precursor with the ligand compound to form a second intermediate. For example, a zirconium precursor such as zirconium oxide (or zirconium acetylacetonate or zirconium acetate hydroxide or a combination thereof) and the like may react with a carboxylic acid compound (e.g., oleic acid) to form a zirconium carboxylate (e.g., oleate). The heating may include reacting the first metal precursor with the ligand compound to form the first intermediate and reacting the second metal precursor with the ligand compound to form the second intermediate.

The temperature for forming the first intermediate and the second intermediate may be greater than or equal to about 110° C., for example, greater than or equal to about 120° C., greater than or equal to about 130° C., greater than or equal to about 140° C., greater than or equal to about 150° C., greater than or equal to about 160° C., greater than or equal to about 170° C., greater than or equal to about 180° C., greater than or equal to about 190° C., greater than or equal to about 200° C., greater than or equal to about 210° C., greater than or equal to about 220° C., greater than or equal to about 230° C., greater than or equal to about 240° C., greater than or equal to about 250° C., greater than or equal to about 260° C., greater than or equal to about 270° C., greater than or equal to about 280° C., greater than or equal to about 290° C., or greater than or equal to about 300° C. The temperature for forming the first intermediate and the second intermediate may be less than or equal to about 400° C., for example, less than or equal to about 390° C., less than or equal to about 380° C., less than or equal to about 370° C., less than or equal to about 360° C., less than or equal to about 350° C., less than or equal to about 340° C., less than or equal to about 330° C., less than or equal to about 320° C., less than or equal to about 310° C., or less than or equal to about 300° C. In an embodiment, the temperature for forming the first intermediate and the second intermediate may be for example less than or equal to about 280° C., less than or equal to about 270° C., less than or equal to about 260° C., less than or equal to about 250° C., or less than or equal to about 240° C.

The heating may include reacting the first metal precursor with the organic ligand to form the first intermediate and reacting the first intermediate with the chalcogen precursor to form a third intermediate (e.g., by injecting the chalcogen precursor before the second metal precursor or the second intermediate). The method may further include reacting the third intermediate with the second metal precursor (or the second intermediate).

For example, a barium precursor such as barium oxide (or a barium carboxylate such as barium acetate) and the like may be reacted with a carboxylic acid compound (e.g., oleic acid) to form barium oleate, and then a sulfur precursor may be injected thereto to form barium sulfide. The formed barium sulfide may be reacted with a second metal precursor (e.g., zirconium oxide, zirconium oleate, zirconium acetylacetonate, or a combination thereof) under an additional chalcogen precursor if desired to form a semiconductor nanocrystal particle including a transition metal perovskite chalcogenide. Without wishing to be bound by any theory, the formation of the third intermediate may mitigate a problem caused by a reactivity difference between the second metal precursor and the first metal precursor.

A temperature for forming the third intermediate is not particularly limited but appropriately determined at the reaction temperature or lower. For example, the temperature for forming the third intermediate may be greater than or equal to about 150° C., for example, greater than or equal to about 200° C., greater than or equal to about 250° C., or greater than or equal to about 300° C., and less than or equal to about 400° C., for example, less than or equal to about 350° C., less than or equal to about 300° C., or less than or equal to about 250° C.

The method may adopt an appropriately selected ratio between the first metal precursor and the second metal precursor without a particular limit.

For example, the amount of the second metal precursor may be greater than or equal to about 0.9 moles, for example, greater than or equal to about 1 moles, greater than or equal to about 1.5 moles, greater than or equal to about 2 moles, or greater than or equal to about 3 moles based on about one mole of the first metal precursor. Based on about 1 mole of the first metal precursor, the second metal precursor may be used in an amount of less than or equal to about 5 moles, for example less than or equal to about 4.5 moles, less than or equal to about 4 moles, less than or equal to about 3.5 moles, less than or equal to about 3 moles, less than or equal to about 2.5 moles, less than or equal to about 2 moles, or less than or equal to about 1.5 moles. In an embodiment, based on about 1 mole of the first metal precursor, the second metal precursor may be used in an amount of less than or equal to about 10 moles, less than or equal to about 9 moles, less than or equal to about 8 moles, less than or equal to about 7 moles, or less than or equal to about 6 moles.

For example, based on about 1 mole of the second metal precursor, the first metal precursor may be used in an amount of greater than or equal to about 0.9 moles, for example, greater than or equal to about 1 mole, greater than or equal to about 1.5 moles, greater than or equal to about 2 moles, or greater than or equal to about 3 moles. Based on about 1 mole of the second metal precursor, the first metal precursor may be used in an amount of less than or equal to about 5 moles, for example, less than or equal to about 4.5 moles, less than or equal to about 4 moles, less than or equal to about 3.5 moles, less than or equal to about 3 moles, less than or equal to about 2.5 moles, less than or equal to about 2 moles, or less than or equal to about 1.5 moles. In an embodiment, based on about 1 mole of the second metal precursor, the first metal precursor may be used in an amount of less than or equal to about 10 moles, less than or equal to about 9 moles, less than or equal to about 8 moles, less than or equal to about 7 moles, or less than or equal to about 6 moles.

Based on a total amount of the first and second metal precursors, an amount of a chalcogen precursor may be appropriately determined. For example, based on about 1 mole of a total sum of the first and second metal precursors, the amount of the chalcogen precursor may be greater than or equal to about 0.5 moles, for example, greater than or equal to about 0.6 moles, greater than or equal to about 0.7 moles, greater than or equal to about 0.8 moles, greater than or equal to about 0.9 moles, greater than or equal to about 1 moles, greater than or equal to about 1.1 moles, greater than or equal to about 1.2 moles, greater than or equal to about 2 moles, greater than or equal to about 2.5 moles, greater than or equal to about 3 moles, greater than or equal to about 3.5 moles, greater than or equal to about 4 moles, or greater than or equal to about 4.5 moles. Based on 1 mole of a total sum of the first and second metal precursors, the chalcogen precursor may be used in an amount of less than or equal to about 15 moles, for example, less than or equal to about 14 moles, less than or equal to about 13 moles, less than or equal to about 12 moles, less than or equal to about 11 moles, less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, less than or equal to about 2 moles, less than or equal to about 1.8 moles, or less than or equal to about 1.5 moles.

In the method, an amount of the ligand compound may be appropriately determined with a consideration to a kind of precursor and a kind of solvent. For example, the amount of the ligand compound may be greater than or equal to about 1 moles, greater than or equal to about 2 moles, greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, greater than or equal to about 10 moles, greater than or equal to about 11 moles, greater than or equal to about 12 moles, greater than or equal to about 13 moles, greater than or equal to about 14 moles, greater than or equal to about 15 moles, greater than or equal to about 16 moles, greater than or equal to about 17 moles, greater than or equal to about 18 moles, greater than or equal to about 19 moles, or greater than or equal to about 20 moles based on about 1 mole of the metal precursor. The ligand compound may be used in an amount of less than or equal to about 40 moles, less than or equal to about 30 moles, less than or equal to about 25 moles, less than or equal to about 20 moles, less than or equal to about 15 moles, less than or equal to about 14 moles, less than or equal to about 13 moles, less than or equal to about 12 moles, or less than or equal to about 11 mole based on about 1 mole of the metal precursor. Within the range, a semiconductor nanocrystal particle having a colloid type and based on a transition metal perovskite chalcogenide may be formed.

After completing the reaction, a nonsolvent is added to reaction products and nanocrystal particles coordinated with, e.g., bound to, the ligand compound may be separated from one another. The nonsolvent may be a polar solvent that is miscible with the organic solvent used in reactions and is not capable of dispersing the produced nanocrystals therein. The nonsolvent may be selected depending the solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, methyl acetate, ethyl acetate, ethylene glycol, solvents having a similar solubility parameter to the foregoing listed nonsolvents, or a combination thereof. The separation may use centrifugation, sedimentation, chromatography, or distillation. Separated nanocrystals may be added to a washing solvent and washed, if desired. Types of the washing solvent are not particularly limited and may be the ones having a solubility parameter similar to that of the ligand and may, for example, include hexane, heptane, octane, chloroform, toluene, benzene, and the like.

In an embodiment, an electronic device includes the semiconductor nanocrystal particle. The device may include a display device, a light emitting diode (LED), an organic light emitting diode (OLED), a quantum dot LED, a sensor, a solar cell, an image sensor, or a liquid crystal display (LCD), but is not limited thereto.

In an embodiment, the electronic device may be a photoluminescence element (e.g., a lighting such as a quantum dot sheet or a quantum dot rail or a liquid crystal display (LCD)) or an electroluminescent device (e.g., QD LED).

In an embodiment, the electronic device may include a quantum dot sheet and the semiconductor nanocrystal particle may be included in the quantum dot sheet (e.g., in a form of a semiconductor nanocrystal-polymer composite). In an embodiment, the electronic device may be an electroluminescent device.

Hereinafter, specific examples are illustrated. However, these examples are exemplary, and the present disclosure is not limited thereto.

EXAMPLES

Analysis Method
1. Photoluminescence Analysis

Photoluminescence (PL) spectra of the produced nanocrystals are obtained using a Hitachi F-7000 spectrometer at an irradiation wavelength of 374 nanometers (nm).
2. Ultraviolet (UV) Spectroscopy Analysis A UV spectroscopy analysis is performed by using a Hitachi U-3310 spectrometer to obtain a UV-Visible absorption spectrum.
3. Transmission Electron Microscopy (TEM) Analysis Transmission electron microscope photographs of nanocrystals are obtained using an UT F30 Tecnai electron microscope.
4. High-Resolution Transmission Electron Microscopy (HR-TEM) Analysis A HRTEM analysis is performed using TEM-Titan G2.
5. X-ray Diffraction (XRD) Analysis A XRD analysis is performed using a Philips XPert PRO equipment with a power of 3 kW to confirm crystal structures of the semiconductor nanocrystals.

Example 1

Figure 2:
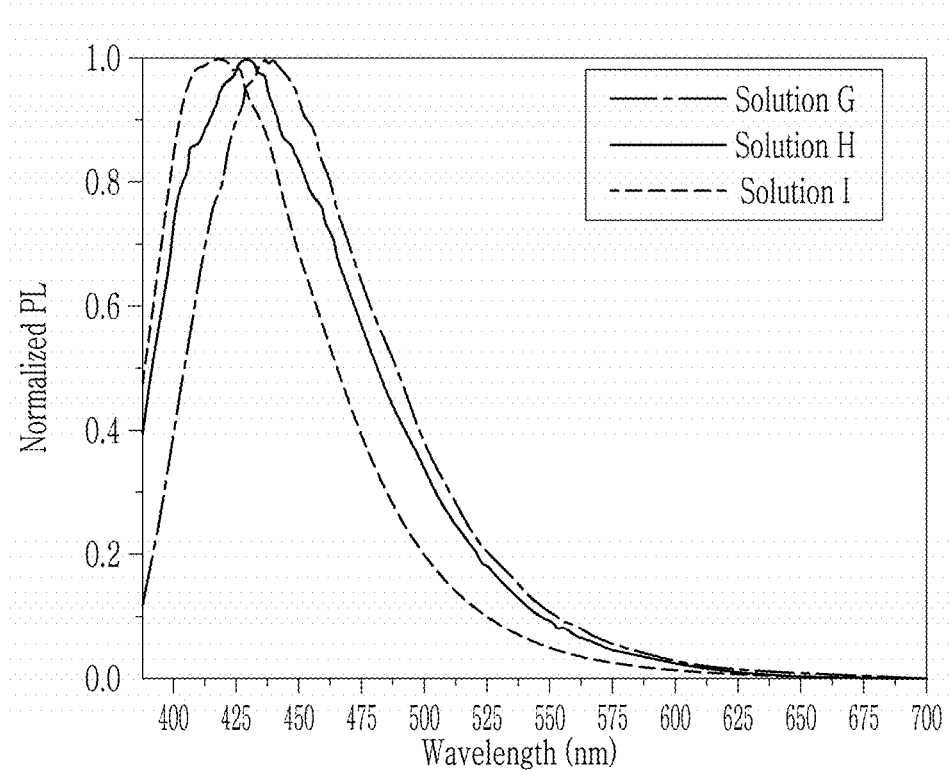
FIG. 2 shows photoluminescence (PL) spectra showing the semiconductor nanocrystal particles produced in Examples 1 to 3.

A mixture of barium acetate and a zirconium precursor (zirconium acetate hydroxide, for example, purchased from Sigma Aldrich Co., Ltd.) in a ratio of 1:1 (mole ratio) and oleic acid are dissolved in a solvent of 1-octadecene (ODE) in a 200 milliliter (mL) reactor, and the reactor is heated under vacuum at 90° C. for 60 minutes. The oleic acid is in an amount of 10 moles per 1 mole of the metal precursor mixture. After one hour, an atmosphere in the reactor is converted into inert gas such as nitrogen or argon. Then, a temperature in the reactor is increased to 330° C., S/ODE (i.e., sulfur dispersed in octadecene) is injected thereinto, and the mixture is reacted at 310° C. for 30 minutes or 50 minutes. An amount of sulfur is about 10 moles based on 1 mole of the metal precursor mixture. The reaction solution is rapidly cooled down to room temperature, acetone is added thereto, the mixture is centrifuged, and a precipitate obtained therefrom is dispersed in toluene. A UV spectroscopic analysis and a PL spectroscopic analysis are performed regarding the obtained semiconductor nanocrystal particle (30 minute reaction). The results are shown in Table 1 and FIGS. 1 and 2.

Figure 3:
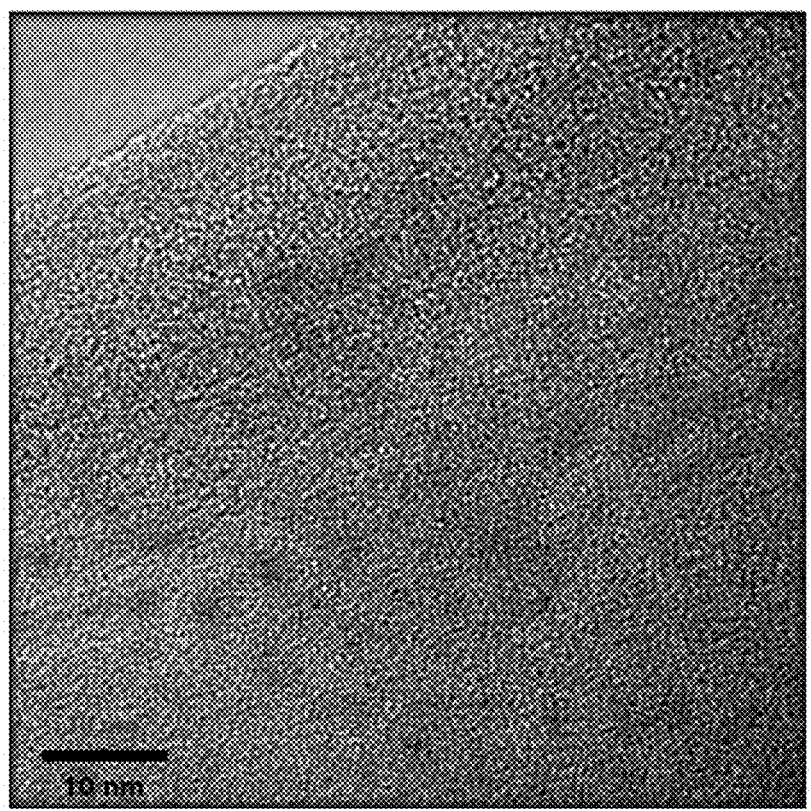
FIG. 3 shows a high-resolution transmission electron microscopy (HRTEM) image showing the semiconductor nanocrystal particles produced in Example 1 (reaction time 50 minutes).

A HRTEM analysis is performed regarding the obtained quantum dot (50 minute reaction), and the results are shown in FIG. 3. The results of FIG. 3 confirm formation of a semiconductor nanocrystal particle having a size of 2 nm to 4 nm.

Figure 4:
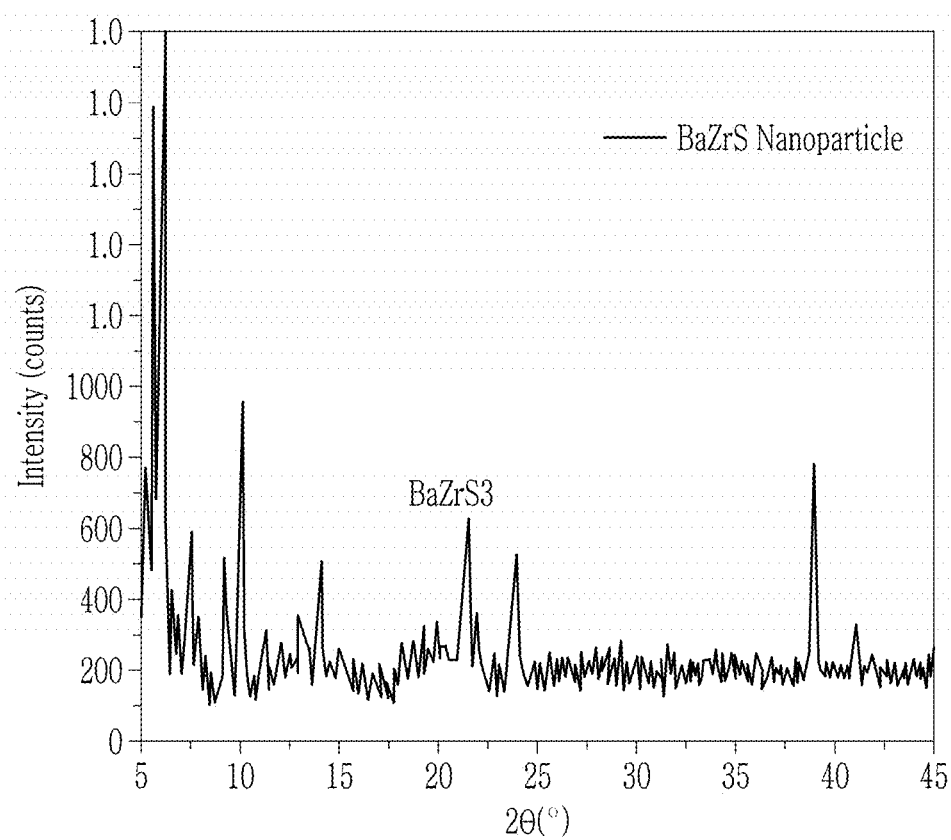
FIG. 4 shows an X-ray diffraction spectrum showing the semiconductor nanocrystal particle (Solution G) produced in Example 1.

An X-ray diffraction analysis is performed regarding the semiconductor nanocrystal (30 minute reaction) is performed, and the result is shown in FIG. 4. Referring to the result of FIG. 4, the semiconductor nanocrystal includes a $BaZrS_3$ crystal structure.

Example 2

Barium acetate and oleic acid in a molar ratio of 1:10 are dissolved in a 1-octadecene solvent in a 200 mL reactor, and the solution is heated at 90° C. for 60 minutes under vacuum. After 1 hour, an atmosphere in the reactor is converted into argon. Then, a temperature in the reactor is increased to 330° C., and 10 moles of S/ODE based on 1 mole of barium acetate is injected thereto for 15 minutes to obtain a reaction mixture including barium sulfide (BaS). Then, zirconium acetate hydroxide and oleic acid are dissolved in octadecene and reacted therewith at 90° C. for 60 minutes to prepare a zirconium-containing precursor. The oleic acid is used in an amount of 10 moles based on 1 mole of zirconium acetate hydroxide.

The reaction mixture is increased to 310° C., the obtained zirconium-containing precursor is injected thereinto, and then, the mixture is reacted at 280° C. for 30 minutes.

After the reaction, the reaction solution is rapidly cooled down to room temperature, acetone is added thereto, the mixture is centrifuged to obtain a precipitate, and the precipitate is dispersed in toluene. A UV spectroscopic analysis and a PL spectroscopic analysis regarding the obtained semiconductor nanocrystal particle are performed, and the results are shown in Table 1 and FIGS. 1 and 2.

Example 3

Barium acetate and oleic acid in a molar ratio of 1:10 are dissolved in a 1-octadecene solvent in a 200 mL reactor, and the reactor is heated at 90° C. for 60 minutes (min) under vacuum. After one hour, an atmosphere in the reactor is converted into argon. Then, a temperature in the reactor is increased to 330° C., and a Zr precursor and a S precursor (i.e., S/ODE) are injected thereinto, is reacted for 30 minutes or 50 minutes.

The Zr precursor is prepared by using 10 moles of oleic acid based on 1 mole of zirconium acetate hydroxide, and a total amount of S is adjusted to be 10 moles based on 1 mole of the used metal precursor.

TABLE 1

| | Synthesis condition | | | Photoluminescence properties | |
|---|---|---|---|---|---|
| | Precursor Molar ratio (Ba:Zr:S) | Injection/ Growth Temp. (° C.) | Growth time (min) | PLQY (%) | PL max. (nm) |
| Example 1 Solution G | 1:1:10 | 330/310 | 30 | 37.7 | 440 |
| Example 2 Solution H | 1:1:10 | 330/310 | 30 | 11.2 | 435 |
| Example 3 Solution I | 1:1:10 | 330/330 | 30 | 16.5 | 430 |

PLQY = Photoluminescence Quantum Yield (i.e., quantum efficiency)
PL max. = Photoluminescence Maximum Referring to the result of Table 1, a barium zirconium sulfide-based semiconductor nanocrystal includes neither lead nor cadmium but may show a relatively enhanced level of photoluminescence properties.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A semiconductor nanocrystal particle comprising a transition metal chalcogenide comprising $BaZrS_3$, $SrZrS_3$, $CaZrS_3$, $SrTiS_3$, $BaTiS_3$, or $BaZr_{1-x}Ti_xS_3$, wherein x is greater than 0 equal to 0.5, $BaZrSe_3$, $SrZrSe_3$, $CaZrSe_3$, $SrTiSe_3$, or $BaZr_{1-x'}Ti_{x'}Se_3$, wherein x' is greater than 0 and less than or equal to 0.5, $BaZrTe_3$, $SrZrTe_3$, $CaZrTe_3$, $SrTiTe_3$, $BaTiTe_3$, or $BaZr_{1-x''}Ti_{x''}Te_3$, wherein x" is greater than 0 and less than or equal to 0.5; or a combination thereof, wherein the semiconductor nanocrystal particle has a size of greater than or equal to about 0.5 nanometers and less than or equal to about 20 nanometers, and wherein the semiconductor nanocrystal particle is configured to emit a first light at a light irradiation of light.

2. The semiconductor nanocrystal particle of claim 1, wherein the transition metal chalcogenide comprises $BaZrS_3$, $BaZr_{1-x}Ti_xS_3$, wherein x is greater than 0 and less than or equal to 0.5, or a combination thereof.

3. The semiconductor nanocrystal particle of claim 1, wherein the semiconductor nanocrystal particle comprises a perovskite crystal structure.

4. The semiconductor nanocrystal particle of claim 1, wherein the semiconductor nanocrystal particle is configured to emit light with a maximum photoluminescence peak wavelength of from about 400 nanometers to about 500 nanometers.

5. The semiconductor nanocrystal particle of claim 1, wherein the semiconductor nanocrystal particle has a size of less than or equal to about 10 nanometers.

6. The semiconductor nanocrystal particle of claim 1, wherein the semiconductor nanocrystal particle has a size of less than or equal to about 5 nanometers.

7. The semiconductor nanocrystal particle of claim 1, wherein the semiconductor nanocrystal particle has quantum efficiency of greater than or equal to about 10%.

8. The semiconductor nanocrystal particle of claim 1, wherein the semiconductor nanocrystal particle has quantum efficiency of greater than or equal to about 20%.

9. The semiconductor nanocrystal particle of claim 1, wherein the semiconductor nanocrystal particle has quantum efficiency of greater than or equal to about 30%.

10. The semiconductor nanocrystal particle of claim 1, wherein the semiconductor nanocrystal particle has a size of greater than or equal to about 0.5 nm and less than 10 nanometers and the semiconductor nanocrystal particle has quantum efficiency of greater than or equal to about 25%.

11. The semiconductor nanocrystal particle of claim 1, wherein the semiconductor nanocrystal particle comprises an organic ligand on a surface of the semiconductor nanocrystal particle and the organic ligand comprises RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, $R_2POOH$, or a combination thereof, wherein R and R' are each independently a substituted or unsubstituted C1 to C40 aliphatic hydrocarbon, a substituted or unsubstituted C6 to C40 aromatic hydrocarbon, or a combination thereof.

12. The semiconductor nanocrystal particle of claim 11, wherein the ligand comprises carboxylic acid or a derivative thereof comprising 10 or more carbon atoms bound to a surface of the semiconductor nanocrystal particle.

13. A population of a plurality of semiconductor nanocrystal particles, wherein the plurality of semiconductor nanocrystal particles comprises a transition metal chalcogenide comprising $BaZrS_3$, $SrZrS_3$, $CaZrS_3$, $SrTiS_3$, $BaTiS_3$, or $BaZr_{1-x}Ti_xS_3$, wherein x is greater than 0 and less than or equal to 0.5, $BaZrSe_3$, $SrZrSe_3$, $CaZrSe_3$, $SrTiSe_3$, or $BaZr_{1-x'}Ti_{x'}Se_3$, wherein x' is greater than 0 and less than or equal to 0.5, $BaZrTe_3$, $SrZrTe_3$, $CaZrTe_3$, $SrTiTe_3$, $BaTiTe_3$, or $BaZr_{1-x''}Ti_{x''}Te_3$, wherein x" is greater than 0 and less than or equal to 0.5; or a combination thereof, wherein the plurality of semiconductor nanocrystal particles has an average particle size of greater than or equal to about 0.5 nanometers and less than or equal to about 20 nanometers, and wherein the semiconductor nanocrystal particles are configured to emit light at irradiation of light.

14. The population of claim 13, wherein the transition metal chalcogenide comprises $BaZrS_3$, $BaZr_{1-x}Ti_xS_3$, wherein x is greater than 0 and less than or equal to 0.5, or a combination thereof.

15. The population of claim 13, wherein the plurality of semiconductor nanocrystal particles is configured to emit light with a maximum photoluminescence peak wavelength of from about 400 nanometers to about 500 nanometers.

16. The population of claim 13, wherein the plurality of semiconductor nanocrystal particles exhibits quantum efficiency of greater than or equal to about 30%.

17. A method of producing a semiconductor nanocrystal particle, comprising heating a first metal precursor, a second metal precursor, and a chalcogen precursor in the presence of an organic solvent and a ligand compound at a temperature of greater than or equal to about 100° C. and less than or equal to about 400° C., wherein the first metal precursor comprises Ca, Sr, Ba, or a combination thereof, the second metal precursor comprises Ti, Zr, Hf, or a combination thereof, and the chalcogen precursor comprises S, Se, Te, or a combination thereof, and wherein the semiconductor nanocrystal particle comprises a transition metal chalcogenide comprising $BaZrS_3$, $SrZrS_3$, $CaZrS_3$, $SrTiS_3$, or $BaZr_{1-x}Ti_xS_3$, wherein x is greater than 0 and less than or equal to 0.5, $BaZrSe_3$, $SrZrSe_3$, $CaZrSe_3$, $SrTiSe_3$, or $BaZr_{1-x'}Ti_{x'}Se_3$, wherein x' is greater than 0 and less than or equal to 0.5, $BaZrTe_3$, $SrZrTe_3$, $CaZrTe_3$, $SrTiTe_3$, $BaTiTe_3$, or $BaZr_{1-x''}Ti_{x''}Te_3$, wherein x" is greater than 0 and less than or equal to 0.5; or a combination thereof, and the semiconductor nanocrystal particle having a size of less than or equal to about 100 nanometers.

18. The method of claim 17, wherein the first metal precursor and the second metal precursor each independently comprise a metal powder, an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, metal peroxide, or a combination thereof.

19. The method of claim 17, wherein the chalcogen precursor comprises a thiol compound, sulfur dispersed in a phosphine or amine solvent, selenium dispersed in a phosphine or amine solvent, tellurium dispersed in a phosphine or amine solvent, or a combination thereof.

20. The method of claim 17, wherein the organic solvent comprises a primary amine comprising about 6 or more carbon atoms, a secondary amine comprising 6 or more carbon atoms, a tertiary amine comprising about 6 or more carbon atoms, a nitrogen-containing heterocyclic compound, an aliphatic hydrocarbon comprising about 6 or more carbon atoms, an aromatic hydrocarbon comprising about 6 or more carbon atoms, a phosphine compound comprising an aliphatic hydrocarbon group comprising about 6 or more carbon atoms, a phosphine oxide compound comprising an aliphatic hydrocarbon group comprising about 6 or more carbon atoms, an aromatic ether, or a combination thereof.

21. The method of claim 17, wherein the ligand compound comprises RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, $R_2POOH$, or a combination thereof, wherein R and R' is each independently a C1 to C40 substituted or unsubstituted aliphatic hydrocarbon, a C6 to C40 substituted or unsubstituted aromatic hydrocarbon, or a combination thereof.

22. The method of claim 17, wherein the heating comprises reacting the first metal precursor with the ligand compound to form a first intermediate, reacting the second metal precursor with the ligand compound to form a second intermediate, or a combination thereof.

23. The method of claim 17, wherein the heating comprises reacting the first metal precursor with the ligand compound to form a first intermediate, and reacting the first intermediate with the chalcogen precursor to form a third intermediate.

24. The method of claim 23, further comprising reacting the third intermediate with the second metal precursor.

25. The method of claim 24, wherein:
the first metal precursor comprises an oxide, a carboxylate, or a combination thereof;
the ligand compound comprises a carboxylic acid compound; and
the second metal precursor comprises an oxide, an oleate, an acetylacetonate, or a combination thereof.

* * * * *